(12) United States Patent
Sanada et al.

(10) Patent No.: US 9,392,703 B2
(45) Date of Patent: Jul. 12, 2016

(54) PAD STRUCTURE AND MOUNTED STRUCTURE

(71) Applicant: SHINKO ELECTRIC INDUSTRIES CO., LTD., Nagano (JP)

(72) Inventors: Masaki Sanada, Nagano (JP); Syota Miki, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 84 days.

(21) Appl. No.: 14/303,790

(22) Filed: Jun. 13, 2014

(65) Prior Publication Data

US 2014/0374149 A1    Dec. 25, 2014

(30) Foreign Application Priority Data

Jun. 24, 2013 (JP) ................. 2013-132029

(51) Int. Cl.
| | |
|---|---|
| H05K 1/11 | (2006.01) |
| H05K 3/40 | (2006.01) |
| H01L 23/498 | (2006.01) |
| H01L 21/48 | (2006.01) |
| H05K 3/34 | (2006.01) |
| H01L 23/00 | (2006.01) |
| H01L 23/538 | (2006.01) |
| H01L 25/065 | (2006.01) |
| H01L 25/18 | (2006.01) |

(52) U.S. Cl.
CPC .......... *H05K 3/4007* (2013.01); *H01L 21/4853* (2013.01); *H01L 23/49811* (2013.01); *H01L 23/5384* (2013.01); *H01L 24/16* (2013.01); *H01L 24/81* (2013.01); *H01L 25/0652* (2013.01); *H01L 25/18* (2013.01); *H01L 2224/131* (2013.01); *H01L 2224/13082* (2013.01); *H01L 2224/13144* (2013.01); *H01L 2224/16146* (2013.01); *H01L 2224/16225* (2013.01); *H01L 2224/16227* (2013.01); *H01L 2224/16238* (2013.01); *H01L 2224/8182* (2013.01); *H01L 2224/81191* (2013.01); *H01L 2224/81444* (2013.01); *H01L 2924/15192* (2013.01); *H01L 2924/15311* (2013.01); *H05K 1/113* (2013.01); *H05K 3/3436* (2013.01); *H05K 3/4015* (2013.01); *H05K 2201/0338* (2013.01); *H05K 2201/1053* (2013.01); *H05K 2201/10515* (2013.01)

(58) Field of Classification Search
CPC ....... H05K 1/111; H05K 3/4007; H05K 3/24; H05K 3/244
USPC .......... 174/260, 267, 261, 257; 361/767–768, 361/760, 771
See application file for complete search history.

(56) References Cited

U.S. PATENT DOCUMENTS

| | | | | |
|---|---|---|---|---|
| 2007/0205017 | A1* | 9/2007 | Takakusaki | H05K 3/341 174/260 |
| 2012/0152600 | A1* | 6/2012 | Nishioka | H05K 3/3452 174/258 |
| 2013/0105329 | A1* | 5/2013 | Matejat | H01L 21/4853 205/125 |
| 2015/0189752 | A1* | 7/2015 | Hayashi | H05K 1/0326 174/257 |

FOREIGN PATENT DOCUMENTS

JP    2005-142338    6/2005

* cited by examiner

*Primary Examiner* — Hoa C Nguyen
*Assistant Examiner* — Amol Patel
(74) *Attorney, Agent, or Firm* — IPUSA, PLLC

(57) ABSTRACT

A pad structure includes an insulating layer; a first metal layer formed on one surface of the insulating layer and including an intermetallic compound layer of copper and tin or a tin layer; and a second metal layer formed on the first metal layer and including a gold layer.

4 Claims, 5 Drawing Sheets

PAD STRUCTURE AND MOUNTED STRUCTURE

CROSS-REFERENCE TO RELATED APPLICATION

The present application is based on and claims the benefit of priority of Japanese Priority Application No. 2013-132029 filed on Jun. 24, 2013, the entire contents of which are hereby incorporated by reference.

BACKGROUND OF THE INVENTION

1. Field of the Invention

The present invention relates to a pad structure and a mounted structure.

2. Description of the Related Art

Conventionally, a printed circuit board is known that includes at least one insulating layer, two layers of circuit conductive layers formed at both surfaces of the insulating layer, respectively, and vias made of an electroless plating metal filled in via holes formed in the insulating layer for connecting the circuit conductive layers. In this printed circuit board, a part of at least one of the circuit conductive layers is formed by a sputtering method (see Patent Document 1, for example).

Meanwhile, conventionally, it is known that galvanic corrosion is generated when different kinds of metals are in contact with each other, depending on a combination of the metals.

Further, there is a risk that a via (a copper post) formed by an electroless plating, for example, is eroded due to the galvanic corrosion if different kinds of metals are in contact in the via, when removing an unnecessary part of the via by etching, in the conventional printed circuit board. If the via is eroded due to the galvanic corrosion, there may be problems such as where the via disappears, strength is lowered, electrical connection is worsened or the like.

PATENT DOCUMENT

[Patent Document 1] Japanese Laid-open Patent Publication No. 2005-142338

SUMMARY OF THE INVENTION

The present invention is made in light of the above problems, and provides a pad structure and a mounted structure in which generation of galvanic corrosion is suppressed.

According to an embodiment, there is provided a pad structure including an insulating layer; a first metal layer formed on one surface of the insulating layer and including an intermetallic compound layer of copper and tin or a tin layer; and a second metal layer formed on the first metal layer and including a gold layer.

According to another embodiment, there is provided a mounted structure including an insulating layer; a first metal layer formed on one surface of the insulating layer and including an intermetallic compound layer of tin and nickel; a second metal layer formed on the first metal layer and including a nickel layer; a solder layer connected on the second metal layer; and a connecting portion connected on the solder layer.

Note that also arbitrary combinations of the above-described elements, and any changes of expressions in the present invention, made among methods, devices, systems and so forth, are valid as embodiments of the present invention.

BRIEF DESCRIPTION OF THE DRAWINGS

Other objects, features and advantages of the present invention will become more apparent from the following detailed description when read in conjunction with the accompanying drawings.

DETAILED DESCRIPTION OF THE PREFERRED EMBODIMENTS

Figure 1A:
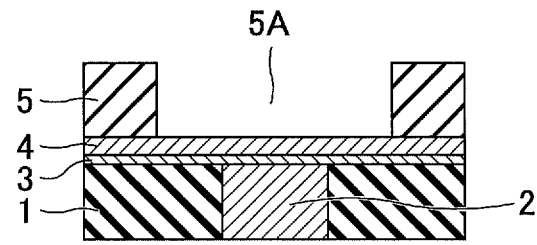
FIG. 1A to FIG. 1E are views illustrating an example of a method of manufacturing a general pad structure.

The invention will be described herein with reference to illustrative embodiments. Those skilled in the art will recognize that many alternative embodiments can be accomplished using the teachings of the present invention and that the invention is not limited to the embodiments illustrated for explanatory purposes.

It is to be noted that, in the explanation of the drawings, the same components are given the same reference numerals, and explanations are not repeated.

Before describing a pad structure, a mounted structure and methods of manufacturing the pad structure and the mounted structure of the embodiment, a general semiconductor device is explained with reference to FIG. 1A to FIG. 1E as a comparison.

(General Pad Structure)

FIG. 1A to FIG. 1E are views illustrating an example of a method of manufacturing a general pad structure 10.

In FIG. 1A, a structure includes an insulating layer 1, a barrier layer 3, a Cu seed layer 4, and a resist 5 formed in this order. A via 2 is provided in the insulating layer 1.

The insulating layer 1 may be a printed circuit board or the like, for example. The via 2 is provided in the insulating layer 1 to penetrate the insulating layer 1 in a thickness direction of the insulating layer 1. The via 2 is made of copper (Cu), for example. The barrier layer 3 is formed on upper surfaces of the insulating layer 1 and the via 2, respectively.

The barrier layer 3 is a metal layer made of titanium (Ti), for example. The barrier layer 3 is provided to suppress diffusion of the Cu seed layer 4 into the insulating layer 1. Further, the barrier layer 3 has a function to ensure adhesion between the Cu seed layer 4 and the insulating layer 1.

The Cu seed layer 4 is formed on the entirety of the upper surface of the barrier layer 3. The Cu seed layer 4 is formed on the entirety of the upper surface of the barrier layer 3 by an electroless plating process or sputtering.

A dry film may be used for the resist 5, for example. The resist 5 is formed to have a desired pattern including an opening 5A by exposing and developing using a photosensitive film. The opening 5A has a circular shape in a plan view. The opening 5A is used for forming a nickel layer 6 and a gold layer 7.

Figure 1B:
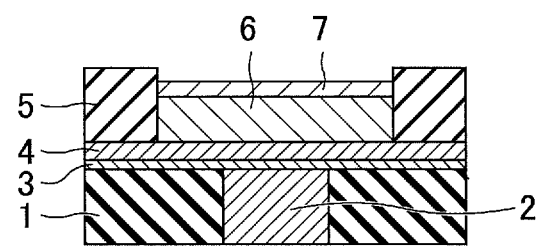

Next, as illustrated in FIG. 1B, the nickel layer 6 is formed on the Cu seed layer 4 within the opening 5A. Thereafter, the gold layer 7 is formed on the nickel layer 6. The nickel layer 6 and the gold layer 7 are formed by an electroplating process, for example.

Figure 1C:
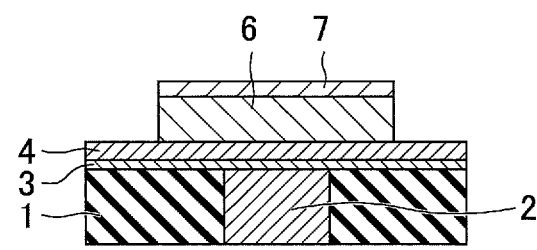

Next, the resist 5 is removed to obtain a structure illustrated in FIG. 1C. The resist 5 may be removed by an etching process using stripping solution, for example.

Finally, a part of the Cu seed layer 4 that is not covered by the nickel layer 6 and the gold layer 7 of the structure is removed by an etching process because this part is an unnecessary part. Further, a part of the barrier layer 3 that is not right below the nickel layer 6 and the gold layer 7 is also removed by an etching process after performing the etching process on the Cu seed layer 4. Then, a pad structure 10 is obtained as illustrated in FIG. 1D.

Figure 1D:
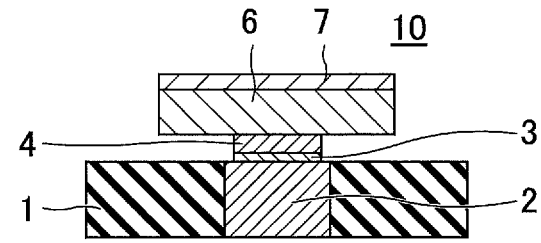

However, when the unnecessary part of the Cu seed layer 4 is removed from the structure illustrated in FIG. 1C by an etching process using Melstrip Cu-3931 (acid type etching solution) manufactured by Meltex Inc., for example, the Cu seed layer 4 is over etched by galvanic corrosion, as illustrated in FIG. 1D. Thus, a part of the Cu seed layer 4 that is right below the nickel layer 6 and the gold layer 7 is also removed.

Further, when the unnecessary part of the barrier layer 3 is removed by an etching process using Melstrip TI-3991 (alkali type etching solution) manufactured by Meltex Inc., for example, after the etching process of the Cu seed layer 4, similar to the Cu seed layer 4, the barrier layer 3 is over etched by galvanic corrosion. Thus, a part of the barrier layer 3 that is right below the nickel layer 6 and the gold layer 7 is also removed.

These happen due to the following reason. Copper of the Cu seed layer 4 and titanium of the barrier layer 3 are metals that may cause galvanic corrosion with gold of the gold layer 7.

Then, when the etching process is performed on the Cu seed layer 4, the part of the Cu seed layer 4 that is covered by the nickel layer 6 and the gold layer 7 is eroded by the galvanic corrosion. Further, when the etching process is performed on the barrier layer 3 under a state in which the Cu seed layer 4 is eroded, the etching solution invades into the eroded portion of the Cu seed layer 4 so that the barrier layer 3 is also over etched by the galvanic corrosion.

As a result, as illustrated in FIG. 1D, the parts of the Cu seed layer 4 and the barrier layer 3 that are right below the nickel layer 6 and the gold layer 7 are eroded so that a so-called undercut is generated.

When such an undercut due to the galvanic corrosion is generated on the Cu seed layer 4 and the barrier layer 3, strengths of the nickel layer 6 and the gold layer 7 become insufficient. Further, as the barrier layer 3, the Cu seed layer 4, the nickel layer 6 and the gold layer 7 are used as a pad, if the undercut is generated at a foot (the barrier layer 3 and the Cu seed layer 4) of the pad, there is a possibility that a stable electrical connection cannot be obtained. Further, there is a risk that the Cu seed layer 4 and the barrier layer 3 disappear by the undercut.

Further, sides of the barrier layer 3, the Cu seed layer 4, the nickel layer 6 and the gold layer 7 illustrated in FIG. 1D are covered by a sealing resin 8 formed at the upper side surface of the insulating layer 1.

Figure 1E:
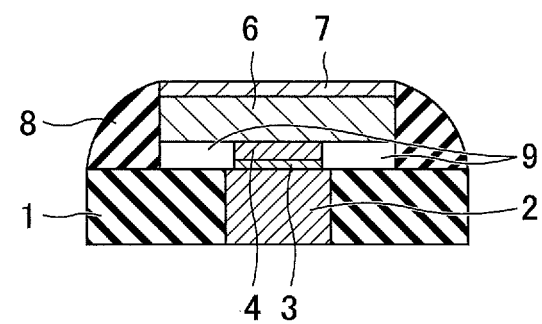

FIG. 1E illustrates an example of a state in which the sides of the barrier layer 3, the Cu seed layer 4, the nickel layer 6 and the gold layer 7 are covered by the sealing resin 8.

Alternatively, the sealing resin 8 may be formed after connecting a bump (see "22" in FIG. 3B, for example) or the like on the gold layer 7.

When the pad structure 10 illustrated in FIG. 1D is sealed by the sealing resin 8, a void 9 may be generated at the undercut portion of the Cu seed layer 4 and the barrier layer 3 at which the sealing resin 8 is not filled. At this time, the void 9 is completely covered by the sealing resin 8 filled at the side surfaces of the barrier layer 3, the Cu seed layer 4, the nickel layer 6 and the gold layer 7 in a plan view. Thus, the void 9 becomes a closed space.

If the void 9 is generated at the undercut portion of the Cu seed layer 4 and the barrier layer 3, for example, air in the void 9 may expand due to a temperature increase when the pad structure 10 is positioned near a semiconductor device, or large current flows through the pad structure 10. This may cause a damage of the pad structure 10.

As such, there are various problems caused by the undercut portion. Here, the reason that the undercut portion is generated on the Cu seed layer 4 and the barrier layer 3 is that the galvanic corrosion is generated on the Cu seed layer 4 and the barrier layer 3.

Figure 2:
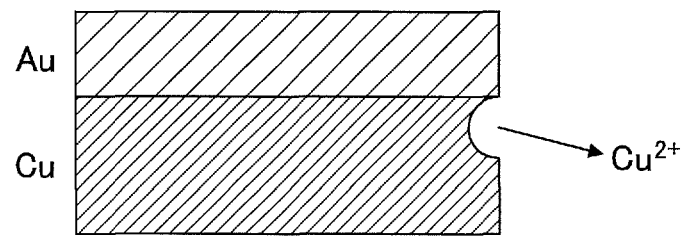
FIG. 2 is a view for explaining galvanic corrosion.

The galvanic corrosion is explained with reference to FIG. 2. FIG. 2 is a view for explaining the galvanic corrosion. When metals having different standard electrode potential such as copper (Cu) and gold (Au), for example, are immersed in electrolyte solution while being in contact with each other, a battery (localized battery) is generated so that a current (localized current) flows between the metals. Then, the metal whose standard electrode potential is lower than that of the other metal becomes metal ion to promote corrosion. This phenomenon is called galvanic corrosion.

When copper (Cu) and gold (Au) contact, as the standard electrode potential of copper (Cu) is lower than that of gold (Au), copper (Cu) becomes metal ion ($Cu^{2+}$) to be dissolved into the electrolyte solution and corrosion is promoted. The reactions that occur when copper (Cu) becomes metal ion ($Cu^{2+}$) due to the galvanic corrosion and is dissolved into the electrolyte solution are as expressed in the following chemical formulas (1) and (2).

$$\tfrac{1}{2}O_2 + H_2O + 2e^- \rightarrow 2OH^- \qquad (1)$$

$$Cu \rightarrow Cu^{2+} + 2e^- \qquad (2)$$

Such galvanic corrosion occurs even when the nickel layer 6 exists between the Cu seed layer 4 and the gold layer 7 as illustrated in FIG. 1D.

Figure 3A:
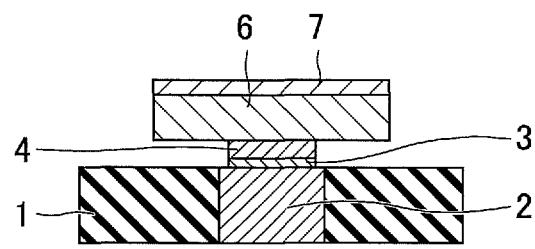
FIG. 3A and FIG. 3B are views illustrating manufacturing steps of a general mounted structure.
Figure 3B:
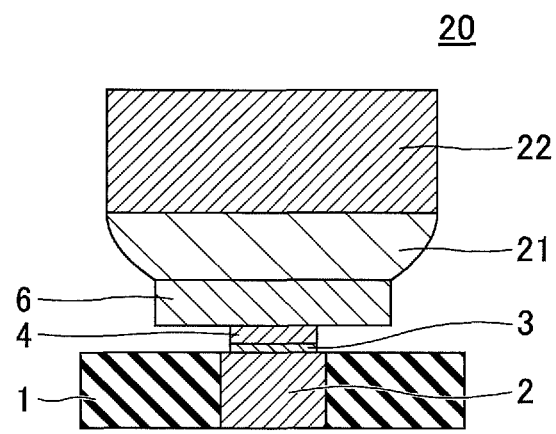

Next, a general mounted structure 20 including the general pad structure 10 is explained with reference to FIG. 3A and FIG. 3B. FIG. 3A and FIG. 3B are views illustrating manufacturing steps of the general mounted structure 20.

The pad structure illustrated in FIG. 3A is the same as the pad structure 10 illustrated in FIG. 1D and undercut is generated on the barrier layer 3 and the Cu seed layer 4 among the barrier layer 3, the Cu seed layer 4, the nickel layer 6 and the gold layer 7 that are used as the pad.

Then, as illustrated in FIG. 3B, the mounted structure 20 is manufactured by connecting a bump 22 on the gold layer 7 of the pad structure 10 through the solder 21. When connecting the bump 22 on the gold layer 7 through the solder 21, the solder 21 and the bump 22 are also connected in addition to the barrier layer 3, the Cu seed layer 4, the nickel layer 6 and the gold layer 7 in a heated state.

When connecting the bump 22 on the gold layer 7, the solder 21 and the bump 22 are pressed to the gold layer 7 under a state that the barrier layer 3, the Cu seed layer 4, the nickel layer 6 and the gold layer 7 that are used as the pad are heated. By this heating process, gold included in the gold layer 7 is diffused into the solder 21. Thus, the gold layer 7 disappears in FIG. 3B.

Further, when manufacturing the mounted structure 20, if the sealing resin ("8" as illustrated in FIG. 1E) that is filled at the side surfaces of the barrier layer 3, the Cu seed layer 4, the nickel layer 6 and the gold layer 7 includes moisture, the moisture moves into the void 9 formed at the undercut portion of the barrier layer 3 and the Cu seed layer 4. Under such a high temperature and high humidity environment, copper (Cu) of the Cu seed layer 4 to which a voltage is applied may migrated and the copper (Cu) may be diffused.

As described above, according to the general pad structure 10 illustrated in FIG. 1D, there is a risk that undercut is generated due to galvanic corrosion. Further, according to the general mounted structure 20 illustrated in FIG. 3B, there is a risk that copper (Cu) in the Cu seed layer 4 is migrated.

According to the embodiment explained below, the pad structure, the mounted structure and methods of manufacturing the pad structure and the mounted structure capable of solving the above problem are provided.

First Embodiment

Figure 4A:
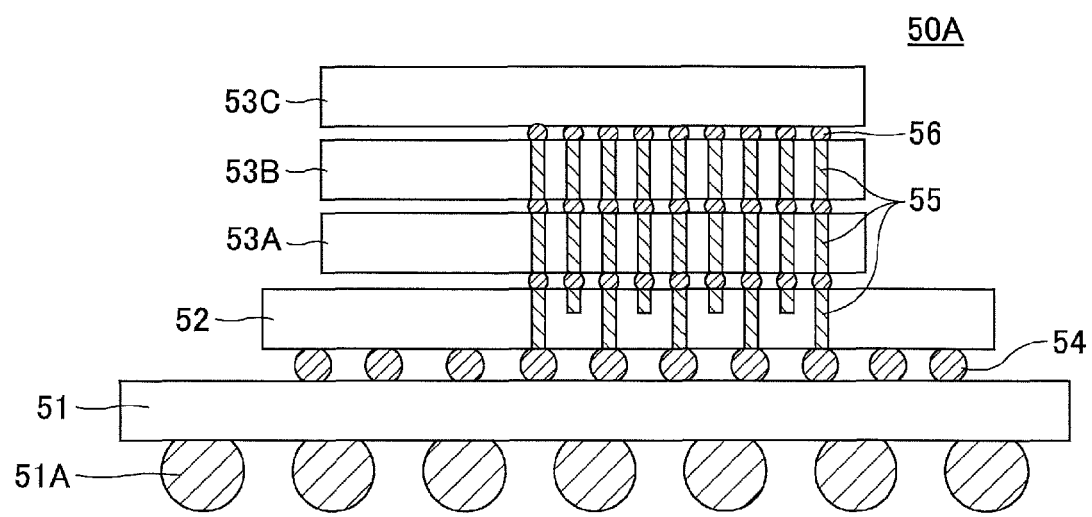
FIG. 4A and FIG. 4B are cross-sectional views illustrating an example of a semiconductor package including a pad structure and a mounted structure of an embodiment.
Figure 4B:
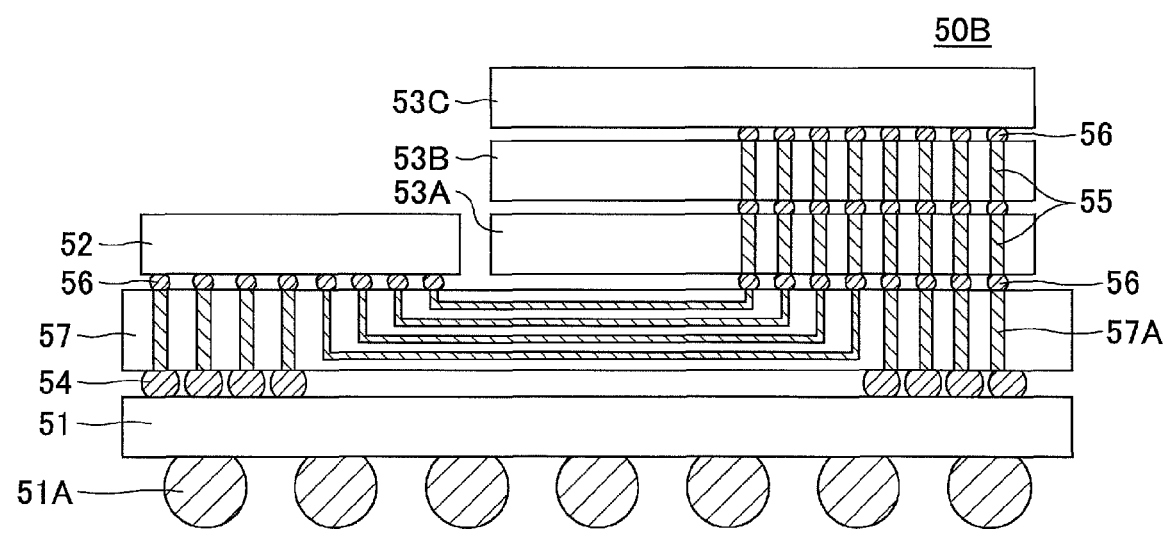

FIG. 4A and FIG. 4B are cross-sectional views respectively illustrating an example of a semiconductor package 50A and a semiconductor package 50B including a pad structure and a mounted structure of the embodiment. FIG. 4A illustrates the semiconductor package 50A having a three-dimensional mounted structure, and FIG. 4B illustrates the semiconductor package 50B having a so-called 2.5 dimensional mounted structure.

The semiconductor package 50A illustrated in FIG. 4A includes a Printed Circuit Board (PCB) 51, a logic chip 52 and memory chips 53A, 53B and 53C.

The semiconductor package 50A further includes solder balls 51A provided at a lower surface of the PCB 51. The logic chip 52 includes a System on a Chip (SoC), a Central Processing Unit (CPU), a Graphic Processing Unit (GPU) and the like, for example.

The logic chip 52 is mounted on pads (not illustrated in FIG. 4A) formed at an upper surface of the PCB 51 by bumps 54, respectively. The memory chips 53A, 53B and 53C are stacked on the logic chip 52 and are electrically connected to the logic chip 52 and the PCB 51 through vias 55 and bumps 56. The bumps 56 are connected to the pads positioned at upper ends of the vias 55, respectively. The vias 55 that penetrate the logic chip 52 and the memory chips 53A and 53B may be so-called Through Silicon Vias (TSV).

The semiconductor package 50B illustrated in FIG. 4B includes the PCB 51, the logic chip 52, the memory chips 53A, 53B and 53C and an interposer 57.

The solder balls 51A are provided at the lower surface of the PCB 51. The interposer 57 is mounted on pads (not illustrated in the drawings) formed at the upper surface of the PCB 51 through the bumps 54, respectively. The logic chip 52 is mounted on the interposer 57 through the bumps 56 at a left side in FIG. 4B, and the memory chip 53A is mounted on the interposer 57 through the bumps 56 at a right side in FIG. 4B. Further, the memory chips 53B and 53C are stacked on the memory chip 53A through the bumps 56.

The logic chip 52 is electrically connected to interconnects 57A that are provided inside the interposer 57 through the bumps 56. The memory chip 53A is electrically connected to the interconnects 57A that are provided inside the interposer 57 through the bumps 56. The bumps 56 are connected to the vias 55 or pads respectively provided at upper ends of the interconnects 57A.

The logic chip 52 and the memory chip 53A are electrically connected with each other through the interconnects 57A and further electrically connected to the PCB 51 through the interconnects 57A. The vias 55 and the interconnects 57A that penetrate the memory chips 53A and 53B and the interposer 57, among the vias 55 and the interconnects 57A may be so-called Through Silicon Vias (TSV). The number of memory chips is not limited.

For the example illustrated in FIG. 4A, the pad structure of the embodiment may be the pad formed at the surface of the PCB 51 to which the bump 54 between the PCB 51 and the logic chip 52 is connected, for example. The pad structure may be the pad formed at the surface of the logic chip 52 to which the bump 56 between the logic chip 52 and the memory chip 53A is connected, for example. The pad structure may be the pad formed at the surface of the memory chip 53A to which the bump 56 between the memory chips 53A and 53B is connected, or the pad formed at the surface of the memory chip 53B to which the bump 56 between the memory chips 53B and 53C is connected, for example.

Further, for the example illustrated in FIG. 4B, the pad structure of the embodiment may be the pad formed at the surface of the PCB 51 to which the bump 54 between the PCB 51 and the interposer 57 is connected, for example. The pad structure may be the pad formed at the surface of the interposer 57 to which the bump 56 between the interposer 57 and the logic chip 52 is connected, for example. The pad structure may be the pad formed at the surface of the interposer 57 to which the bump 56 between the interposer 57 and the memory chip 53A is connected, for example. Further, in FIG. 4B as well, the pad structure may be the pad formed at the surface of the memory chip 53A to which the bump 56 between the memory chips 53A and 53B is connected, or the pad formed at the memory chip 53B to which the bump 56 between the memory chips 53B and 53C is connected, for example.

FIG. 5A to FIG. 5F are views illustrating manufacturing steps of a pad structure 100 of the embodiment. In this embodiment, the same components as explained above for the general pad structure are given the same reference numerals, and explanations are not repeated.

Figure 5A:
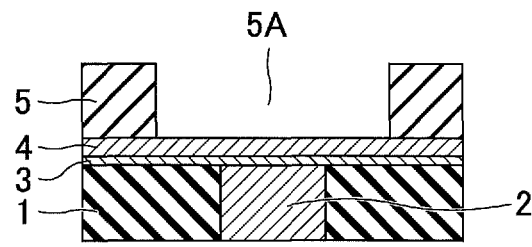
FIG. 5A to FIG. 5F are views illustrating an example of a manufacturing method of a pad structure of the embodiment.

In FIG. 5A, the via 2 is formed in the insulating layer 1. The barrier layer 3 and the Cu seed layer 4 are formed at the upper surface of the insulating layer 1, and the resist 5 is formed on the Cu seed layer 4. This structure is the same as the structure illustrated in FIG. 1A.

The insulating layer 1 corresponds to the insulating layer of the PCB 51, the logic chip 52, the memory chips 53A, 53B and 53C or the interposer 57 as illustrated in FIG. 4A or FIG. 4B, for example. The via 2 is provided in the insulating layer 1 to penetrate the insulating layer 1 in a thickness direction of the insulating layer 1. The via 2 is made of copper (Cu), for example. The via 2 corresponds to the via 55 or the interconnect 57A as illustrated in FIG. 4A or FIG. 4B, for example. The barrier layer 3 is formed on the upper surfaces of the insulating layer 1 and the via 2, respectively.

Figure 5B:
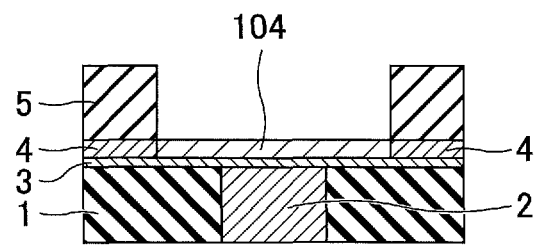

Then, a part of the Cu seed layer 4 (FIG. 5A) exposed at a bottom of the opening 5A is substituted to a displacement plating layer 104 by performing a displacement plating process using an electroless plating process of tin (Sn) with the resist 5, as illustrated in FIG. 5B. The displacement plating layer 104 is an example of a first metal layer.

The displacement plating layer 104 is formed by substituting copper of the Cu seed layer 4 illustrated in FIG. 5A that is exposed from the opening 5A by tin. Thus, the Cu seed layer 4 below the resist 5 remains even after forming the displacement plating layer 104.

There may be a case when the displacement plating layer 104 includes only an intermetallic compound layer of tin and copper, and the displacement plating layer 104 includes both the intermetallic compound layer of tin and copper and a tin layer. Whether the tin layer is included in the displacement plating layer 104 depends on a processing condition of the displacement plating process such as temperature, time or the like. For the intermetallic compound layer of tin and copper, $Cu_3Sn$ or $Cu_6Sn_5$ may be formed.

The displacement plating process may be performed by immersing the structure using UTB-580 manufactured by ISHIHARA CHEMICAL CO. LTD at a temperature of 20 to 50° C. for 5 seconds to 10 minutes, for example.

As the intermetallic compound layer of tin and copper ($Cu_3Sn$ or $Cu_6Sn_5$) is chemically stable, even when the structure is immersed in electrolytic solution such as etching solution or the like under a state where the gold layer 7 and the nickel layer 6 exist, galvanic corrosion does not occur.

Figure 5C:
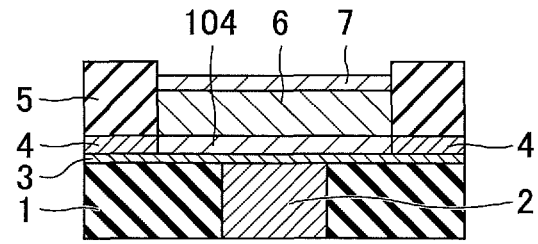

Next, as illustrated in FIG. 5C, the nickel layer 6 is formed on an upper surface of the displacement plating layer 104 in the opening 5A. Thereafter, the gold layer 7 is formed on an upper surface of the nickel layer 6. The nickel layer 6 and the gold layer 7 may be formed by electroplating processes, for example. The nickel layer 6 and the gold layer 7 are an example of a second metal layer.

The nickel layer 6 and the gold layer 7 function as a surface processed layer that enables good adhesion with the bump 22 that is connected through the solder 21, later. When the structure does not include the nickel layer 6, the gold layer 7 may be an example of the second metal layer.

Figure 5D:
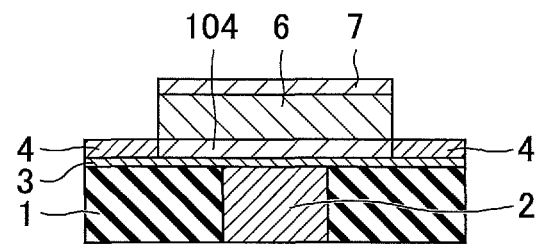

Next, by removing the resist 5 illustrated in FIG. 5C, the structure illustrated in FIG. 5D is obtained. The resist 5 may be removed by an etching process using stripping solution, for example.

Next, an unnecessary part of the Cu seed layer 4 is removed by an etching process using Melstrip Cu-3931 (acid type etching solution) manufactured by Meltex Inc. as etching solution. The unnecessary part of the Cu seed layer 4 is a part that is not substituted to tin by the displacement plating process as it exists below the resist 5 in FIG. 5C.

Further, after the etching process of the Cu seed layer 4, the barrier layer 3 is removed by an etching process using Melstrip TI-3991 (alkali type etching solution) manufactured by Meltex Inc. as etching solution.

Figure 5E:
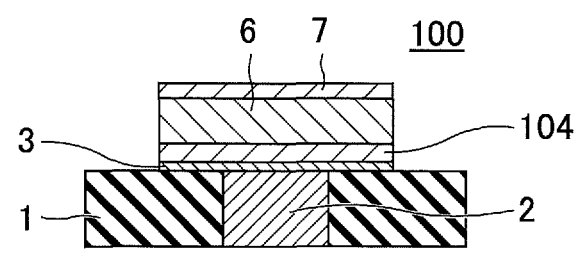

After removing the Cu seed layer 4 and the barrier layer 3 that exist around the displacement plating layer 104 from the structure illustrated in FIG. 5D, the pad structure 100 as illustrated in FIG. 5E is obtained. Different from the general pad structure 10 (see FIG. 1D), a so-called undercut is not generated in the pad structure 100 of the embodiment. The displacement plating layer 104 and the barrier layer 3 form a side surface that is substantially flush with a side surface of the nickel layer 6 and the gold layer 7 in the pad structure 100.

The reason why the displacement plating layer 104 and the barrier layer 3 are capable of forming the side surface that is substantially flush with the side surfaces of the nickel layer 6 and the gold layer 7 is as follows.

First, the intermetallic compound layer of tin and copper included in the displacement plating layer 104 is very chemically stable so that the galvanic corrosion does not occur. Further, the intermetallic compound layer of tin and copper is not removed by the etching solution that removes the Cu seed layer 4. Thus, the intermetallic compound layer of tin and copper included in the displacement plating layer 104 is capable of forming a side surface that is substantially flush with the side surface of the nickel layer 6 and the gold layer 7.

Further, even when the tin layer is included in the displacement plating layer 104, the tin layer is not removed by the etching solution that removes the Cu seed layer 4.

Here, generally, there is a risk that galvanic corrosion occurs for a combination of tin and gold. However, in this embodiment, the tin is not dissolved by the etching solution so that the eroded amount by the galvanic corrosion is very little. Thus, influence by the galvanic corrosion is very little.

Thus, even when the tin layer is included in the displacement plating layer 104, the tin layer is capable of forming a side surface substantially flush with the side surface of the nickel layer 6 and the gold layer 7.

Further, as it is possible to obtain the displacement plating layer 104 having the side surface that is substantially flush with the side surface of the nickel layer 6 and the gold layer 7, etching solution does not adhere to a part of the barrier layer 3 that is below the displacement plating layer 104, the nickel layer 6 and the gold layer 7 when removing the barrier layer 3 by the etching process.

Thus, an influence of the galvanic corrosion to the barrier layer 3 can be almost ignored when removing the barrier layer 3 by etching. Further, even when the tin layer is included in the displacement plating layer 104, an influence of the galvanic corrosion to the tin layer can be almost ignored when removing the barrier layer 3 by etching.

Thus, the barrier layer 3 with the side surface that is substantially flush with the side surfaces of the nickel layer 6 and the gold layer 7 can be obtained.

According to the above described method, after removing the Cu seed layer 4 and the barrier layer 3 that exist around the displacement plating layer 104 by the etching process, the displacement plating layer 104 and the barrier layer 3 having the side surface that is substantially flush with the side surfaces of the nickel layer 6 and the gold layer 7 can be obtained as illustrated in FIG. 5E. According to the pad structure 100 of the embodiment, a so-called undercut is not generated at the displacement plating layer 104 and the barrier layer 3.

Figure 5F:
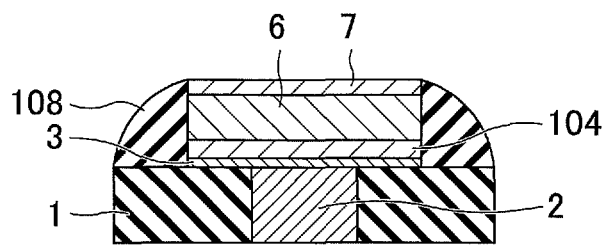

Then, the side surfaces of the barrier layer 3, the displacement plating layer 104, the nickel layer 6 and the gold layer 7 of the pad structure 100 illustrated in FIG. 5E is sealed by a sealing resin 108 to obtain a structure as illustrated in FIG. 5F. As the sealing resin 108 is formed to contact the side surfaces of the barrier layer 3, the displacement plating layer 104, the nickel layer 6 and the gold layer 7, a void like the void 9 generated in the general pad structure 10 (FIG. 1E) is not generated.

As described above, according to the embodiment, the pad structure 100 in which the generation of the galvanic corrosion is suppressed can be provided. Further, as the generation of the galvanic corrosion is suppressed, lowering of strength or lowering of reliability in electrical connection can be suppressed in the pad structure 100. Further, different from the general pad structure 10, disappearance of the Cu seed layer 4 and the barrier layer 3 due to the undercut can be suppressed and generation of defective products can also be suppressed.

Next, a mounted structure including the pad structure 100 of the embodiment is explained with reference to FIG. 6A and FIG. 6B.

Figure 6A:
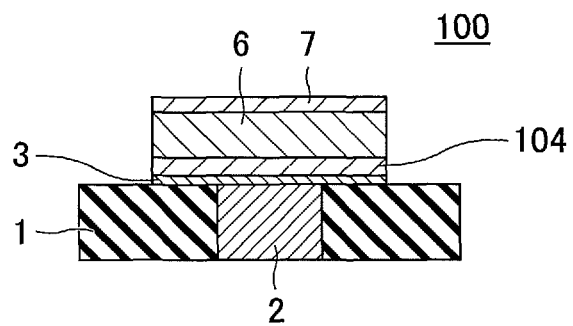
FIG. 6A and FIG. 6B are views illustrating manufacturing steps of the mounted structure of the embodiment.
Figure 6B:
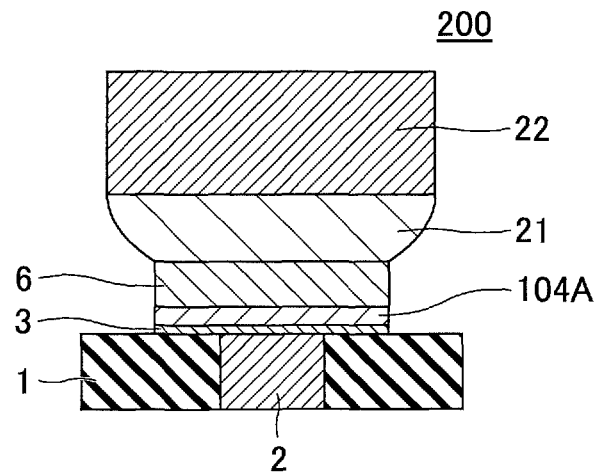

FIG. 6A and FIG. 6B are views illustrating manufacturing steps of a mounted structure 200 of the embodiment.

The pad structure 100 illustrated in FIG. 6A is the same as the pad structure 100 illustrated FIG. 5E. The pad structure 100 includes the barrier layer 3, the displacement plating layer 104, the nickel layer 6 and the gold layer 7 that are used as the pad.

The mounted structure 200 is manufactured by connecting the bump 22 on the gold layer 7 of the pad structure 100 through the solder 21, as illustrated in FIG. 6B. For the solder 21, tin (Sn), tin-silver (Sn—Ag), tin-copper (Sn—Cu), tin-silver-copper (Sn—Ag—Cu), tin-lead (Sn—Pb), tin-bismuth (Sn—Bi) or the like may be used, for example.

When connecting the bump 22 on the gold layer 7, the solder 21 and the bump 22 are pressed to the gold layer 7 under a state that the barrier layer 3, the displacement plating layer 104, the nickel layer 6 and the gold layer 7 that are used as the pad are heated. By this heating process, gold included in the gold layer 7 is diffused into the solder 21. Thus, the gold layer 7 disappears in FIG. 6B.

When the displacement plating layer 104 illustrated in FIG. 6A includes a tin layer, as nickel of the nickel layer 6 diffuses into the tin layer of the displacement plating layer 104 by a heating process, the tin layer of the displacement plating layer 104 becomes an intermetallic compound layer of nickel and tin. FIG. 6B illustrates a displacement plating layer 104A in which the tin layer of the displacement plating layer 104 illustrated in FIG. 6A is substituted by the intermetallic compound layer of nickel and tin.

For the intermetallic compound layer of nickel and tin, $Ni_3Sn_4$, $Ni_3Sn_2$ or $Ni_3Sn$ may be raised. These are all chemically stable and migration does not occur.

Thus, when manufacturing the mounted structure 200, even when the tin layer is included in the displacement plating layer 104, the displacement plating layer 104 can be substituted to the displacement plating layer 104A that includes the intermetallic compound layer of nickel and tin. Thus, migration of tin to be diffused can be suppressed.

Further, when manufacturing the mounted structure 200, as the migration does not occur in the displacement plating layer 104A, diffusion of copper (Cu) due to the migration of copper (Cu) of the Cu seed layer 4, that happens for the general pad structure 10, does not occur.

Thus, according to the embodiment, by suppressing the migration, the mounted structure 200 with an improved reliability as an apparatus can be provided.

The amount of tin included in the tin layer of the displacement plating layer 104 may be set such that tin included in the tin layer forms the intermetallic compound with nickel included in the nickel layer 6 when connecting the bump 22 on the nickel layer 6 and the gold layer 7 through the solder 21 under a state that the nickel layer 6 and the gold layer 7 are heated. This amount may be previously calculated by an experiment or the like.

As such, the entirety of the tin layer of the displacement plating layer 104 becomes the intermetallic compound of tin and nickel included in the nickel layer 6 when manufacturing the mounted structure 200, and the migration of tin can be suppressed.

Although an example is explained above in which the barrier layer 3 is formed on the upper surfaces of the insulating layer 1 and the via 2, the pad structure 100 may not include the barrier layer 3.

Further, the titanium metal layer is exemplified as the barrier layer 3 in the above embodiment. Alternatively, tantalum (Ta), tungsten (W), vanadium (V), chromium (Cr), zirconium (Zr), niobium (Nb), molybdenum (Mo), hafnium (Hf), titanium nitride (TiN), tantalum nitride (TaN) or the like may be used as the barrier layer 3. By using such a metal layer, diffusion of copper can be suppressed.

Further, a stacked layer structure of silicon nitride and silicon oxide ($SiN/SiO_2$), silicon oxynitride (SiON), an insulating layer formed by various kinds of resin, an organic substrate material or the like may be used as the insulating layer 1. Further, the upper surface of a part of the insulating layer 1 at a periphery of the via 2, and the upper surface of the via 2 may protrude upward than an upper surface of the remaining part of the insulating layer 1 apart from the via 2. Even in such a case, the displacement plating layer 104, the nickel layer 6 and the gold layer 7 can be formed by a plating process and the bump 22 can be connected to the gold layer 7 through the solder 21.

Further, although an example is explained above in which the nickel layer 6 and the gold layer 7 are used as an example of the second metal layer, a palladium (Pd) layer may be inserted between the nickel layer 6 and the gold layer 7. In such a case, a stacked structure of the nickel layer 6, the palladium layer and the gold layer 7 is an example of the second metal layer.

Further, the gold layer 7 may be directly formed on the displacement plating layer 104 without forming the nickel layer 6. In this case, the gold layer 7 is an example of the second metal layer. Further, in this case, the gold layer 7 diffuses into the solder 21 in a mounting step and intermetallic compound by a reaction of tin and the solder 21 is formed.

According to the embodiment, a pad structure and a mounted structure in which generation of galvanic corrosion is suppressed are provided.

Various aspects of the subject-matter described herein are set out non-exhaustively in the following numbered clauses:

1. A method of manufacturing a pad structure, including:
    forming a copper seed layer on one surface of an insulating layer;
    forming a first metal layer including an intermetallic compound layer of copper and tin or a tin layer by performing a displacement plating process using tin on the copper seed layer; and
    forming a second metal layer including a gold layer on the first metal layer.

2. A method of manufacturing a mounted structure, comprising:
    forming a copper seed layer on one surface of an insulating layer;
    forming a first metal layer including a tin layer by performing a displacement plating process using tin on the copper seed layer;
    forming a second metal layer including a nickel layer on the first metal layer; and
    connecting a solder layer, to an upper portion of which a connecting portion is connected, on the second metal layer under a state that the second metal layer is heated,
    wherein in the connecting, an intermetallic compound layer of tin and nickel is generated by the tin layer included in the first metal layer and nickel included in the second metal layer.

Although a preferred embodiment of the pad structure, the mounted structure and the methods of manufacturing the pad structure and the mounted structure has been specifically illustrated and described, it is to be understood that minor modifications may be made therein without departing from the spirit and scope of the invention as defined by the claims.

The present invention is not limited to the specifically disclosed embodiments, and numerous variations and modifications may be made without departing from the spirit and scope of the present invention.

What is claimed is:

1. A pad structure comprising:
an insulating layer;
a barrier metal layer formed on the insulating layer and made of titanium;
a first metal layer formed on the barrier metal layer and including an intermetallic compound layer of $Cu_3Sn$ or $Cu_6Sn_5$; and
a second metal layer formed on the first metal layer and composed of a nickel layer and a gold layer formed on the nickel layer,
wherein side surfaces of the barrier metal layer, the first metal layer, and the nickel layer and the gold layer of the second metal layer are substantially flush with each other.

2. The pad structure according to claim 1,
wherein the first metal layer further includes a tin layer provided between the intermetallic compound layer of $Cu_3Sn$ or $Cu_6Sn_5$, and the nickel layer of the second metal layer.

3. A mounted structure comprising:
an insulating layer;
a barrier metal layer formed on the insulating layer and made of titanium;
a first metal layer formed on the barrier metal layer and including an intermetallic compound layer of $Cu_3Sn$ or $Cu_6Sn_5$;
a second metal layer formed on the first metal layer and composed of a nickel layer;
a solder layer connected on the second metal layer; and
a connecting portion connected on the solder layer,
wherein side surfaces of the barrier metal layer, the first metal layer, and the second metal layer of the second metal layer are substantially flush with each other.

4. The mounted structure according to claim 3,
wherein the first metal layer further includes an intermetallic compound layer of $Ni_3Sn_4$, $Ni_3Sn_2$ or $Ni_3Sn$ provided between the intermetallic compound layer of $Cu_3Sn$ or $Cu_6Sn_5$, and the nickel layer of the second metal layer.

* * * * *